United States Patent
Gotanda et al.

(10) Patent No.: US 10,644,238 B2
(45) Date of Patent: May 5, 2020

(54) METHOD AND APPARATUS FOR MANUFACTURING SEMICONDUCTOR ELEMENTS

(71) Applicant: Kabushiki Kaisha Toshiba, Minato-ku (JP)

(72) Inventors: Takeshi Gotanda, Yokohama (JP); Shigehiko Mori, Kawasaki (JP); Akihiro Matsui, Chigasaki (JP); Haruhi Oooka, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/133,343

(22) Filed: Sep. 17, 2018

(65) Prior Publication Data

US 2019/0019952 A1    Jan. 17, 2019

Related U.S. Application Data

(62) Division of application No. 15/258,191, filed on Sep. 7, 2016, now Pat. No. 10,109,795.

(30) Foreign Application Priority Data

Sep. 15, 2015 (JP) ................. 2015-182262

(51) Int. Cl.
*H01L 51/00* (2006.01)
*H01L 51/56* (2006.01)
(Continued)

(52) U.S. Cl.
CPC ...... *H01L 51/0003* (2013.01); *H01L 51/0028* (2013.01); *H01L 51/424* (2013.01);
(Continued)

(58) Field of Classification Search
CPC ......... H01L 51/44; H01L 51/00; H01L 51/42; H01L 51/52; H01L 51/56; H01L 51/0003; H01L 51/0028; H01L 51/424
(Continued)

(56) References Cited

U.S. PATENT DOCUMENTS 5,622,567 A * 4/1997 Kojima ................. C23C 14/022
                                                                118/726
9,391,287 B1 * 7/2016 Huang ................ H01L 51/4213
(Continued)

FOREIGN PATENT DOCUMENTS

JP      2011-505078        2/2011
JP      2014-49551 A       3/2014
(Continued)

OTHER PUBLICATIONS

Anyi Mei et al., "A hole-conductor-free, Fully Printable Mesoscopic Perovskite Solar Cell With High Stability", Science, vol. 345, Issue 6194, Jul. 18, 2014, 23 pages.
(Continued)

*Primary Examiner* — Sheikh Maruf
(74) *Attorney, Agent, or Firm* — Oblon, McClelland, Maier & Neustadt, L.L.P.

(57) ABSTRACT

The embodiment provides a method and an apparatus for manufacturing a semiconductor element showing high conversion efficiency and having a perovskite structure. The embodiment is a method for manufacturing a semiconductor element comprising an active layer having a perovskite structure. Said active layer is produced by the steps of: forming a coating film by directly or indirectly coating a first or second electrode with a coating solution containing a precursor compound for the perovskite structure and an organic solvent capable of dissolving said precursor compound; and then starting to blow a gas onto said coating film
(Continued)

before formation reaction of the perovskite structure is completed in said coating film. Another embodiment is an apparatus for manufacturing a semiconductor element according to the above method.

7 Claims, 11 Drawing Sheets

(51) Int. Cl.
  *H01L 51/42* (2006.01)
  *H01L 51/50* (2006.01)
(52) U.S. Cl.
  CPC .......... *H01L 51/56* (2013.01); *H01L 51/0037* (2013.01); *H01L 51/5012* (2013.01); *H01L 2251/308* (2013.01); *Y02E 10/549* (2013.01); *Y02P 70/521* (2015.11)
(58) Field of Classification Search
  USPC .......................................................... 438/7
  See application file for complete search history.

(56) References Cited

U.S. PATENT DOCUMENTS

| | | | |
|---|---|---|---|
| 9,793,056 | B1 | 10/2017 | Bag |
| 2006/0105491 | A1 | 5/2006 | Brabec |
| 2006/0154384 | A1* | 7/2006 | Murphy .............. H01L 51/0003 438/7 |
| 2007/0007513 | A1 | 1/2007 | Conoci |
| 2007/0071881 | A1 | 3/2007 | Chua |
| 2008/0124522 | A1 | 5/2008 | Chuman |
| 2009/0050206 | A1 | 2/2009 | Halls |
| 2009/0133751 | A1 | 5/2009 | Sreenivasan et al. |
| 2013/0099224 | A1 | 4/2013 | Iijima |
| 2013/0112951 | A1 | 5/2013 | Xia |
| 2013/0236999 | A1 | 9/2013 | Lee |
| 2013/0293082 | A1 | 11/2013 | Forrest |
| 2014/0150868 | A1 | 6/2014 | Ichibayashi |
| 2014/0203244 | A1 | 7/2014 | Hack |
| 2014/0206131 | A1 | 7/2014 | Lin |
| 2015/0228900 | A1* | 8/2015 | Takii .................. H01L 51/0003 438/7 |
| 2015/0311364 | A1* | 10/2015 | Wu ..................... H01L 51/0003 438/82 |
| 2015/0318477 | A1* | 11/2015 | Irwin .................. H01L 51/0003 556/35 |
| 2015/0357591 | A1* | 12/2015 | Karunadasa ........ H01L 51/4226 136/256 |
| 2016/0005547 | A1* | 1/2016 | Seok .................. H01L 51/4226 136/255 |
| 2016/0013434 | A1* | 1/2016 | Snaith ................ H01L 51/4226 136/252 |
| 2016/0111224 | A1* | 4/2016 | Charbonneau ....... H01G 9/2027 136/255 |
| 2016/0141112 | A1* | 5/2016 | Aswani ............... H01L 51/0003 136/263 |
| 2016/0197281 | A1 | 7/2016 | Momose |
| 2016/0248028 | A1 | 8/2016 | Huang |
| 2016/0260918 | A1 | 9/2016 | Gotanda et al. |
| 2016/0276612 | A1 | 9/2016 | Gotanda |
| 2016/0343965 | A1 | 11/2016 | Marks |
| 2016/0351808 | A1 | 12/2016 | Luchinger |
| 2016/0372697 | A1 | 12/2016 | Kakizoe |
| 2017/0018371 | A1* | 1/2017 | Suzuka ............... H01L 51/0003 |
| 2017/0133163 | A1 | 2/2017 | Russell |
| 2017/0084399 | A1* | 3/2017 | Vak .................... H01L 51/0004 |
| 2017/0084400 | A1* | 3/2017 | Cheng ................ H01L 51/4226 |
| 2017/0084848 | A1 | 3/2017 | Gao |
| 2017/0133161 | A1 | 5/2017 | Huang |
| 2017/0152608 | A1* | 6/2017 | Jin ............................. C30B 7/14 |
| 2017/0162809 | A1* | 6/2017 | Fang .................. H01L 51/4226 |
| 2017/0221729 | A1* | 8/2017 | Madigan ............ H01L 21/6715 |
| 2018/0151813 | A1* | 5/2018 | Zhu .................... H01L 51/0007 |
| 2018/0261394 | A1* | 9/2018 | Bag ........................ H01L 51/424 |
| 2018/0269005 | A1* | 9/2018 | Zhu ...................... H01G 9/0036 |
| 2019/0245155 | A1* | 8/2019 | Heath ................ H01L 51/0048 |
| 2019/0287733 | A1* | 9/2019 | Kim .................... H01L 51/0003 |
| 2019/0305168 | A1* | 10/2019 | Honda ................... H01L 51/44 |
| 2019/0362905 | A1* | 11/2019 | Kusumoto .......... H01L 51/4213 |

FOREIGN PATENT DOCUMENTS

| | | |
|---|---|---|
| JP | 2014-49596 A | 3/2014 |
| JP | 2014-49631 A | 3/2014 |
| JP | 2014-72327 A | 4/2014 |
| JP | 2015-56430 A | 3/2015 |
| JP | 2015-133467 | 7/2015 |
| JP | 2016-162911 A | 9/2016 |
| JP | 2016-178156 A | 10/2016 |
| WO | WO2009/031422 | 3/2009 |
| WO | WO2014/045021 | 3/2014 |

OTHER PUBLICATIONS

Zhen Li et al., "Laminated Carbon Nanotube Networks for Metal Electrode-Free Efficient Perovskite Solar Cells", ACSNANO, Jun. 12, 2014, 8 pages.

Office Action dated Feb. 2, 2018, in Japanese Patent Application No. 2015-182262.

Meng Zhang et al., Chemical Communications, "Facile preparation of smooth perovskite films for efficient mesa/planar hybrid structured perovskite solar cells", May 2015, vol. 51, p. 10038-10041.

* cited by examiner

| SECOND ELECTRODE (Ag) |
| PROTECTIVE LAYER (BCP) |
| PROTECTIVE LAYER (PCBM) |
| ACTIVE LAYER |
| UNDERCOAT LAYER (PEDOT:PSS) |
| FIRST ELECTRODE (ITO) |
| GLASS SUBSTRATE |

METHOD AND APPARATUS FOR MANUFACTURING SEMICONDUCTOR ELEMENTS

CROSS-REFERENCE TO RELATED APPLICATIONS

This application is a divisional application of U.S. application Ser. No. 15/258,191, filed on Sep. 7, 2016, which is based upon and claims the benefit of priority from the prior Japanese Patent Application No. 2015-182262, filed on Sep. 15, 2015, the entire contents of which are incorporated herein by reference.

FIELD

The present disclosure relates to a method and an apparatus for manufacturing high-efficient and large-area semiconductor elements.

BACKGROUND

Semiconductor elements, such as photoelectric conversion devices and light-emitting devices, have been hitherto manufactured according to relatively complicated methods, such as, a vapor-deposition process. If it becomes possible to produce the semiconductor elements by coating or printing, they can be obtained more easily and inexpensively than ever before and hence many researches are in progress to develop such methods. Meanwhile, vigorous studies are also under way to develop semiconductor elements, such as, solar cells, sensors and light-emitting devices, made of organic materials or composite materials of organic and inorganic components. Those studies are aimed to develop elements having high efficiency in photoelectric conversion or in luminescence. As a target of those studies, perovskite semiconductor is now gathering attention because it can be produced by a coating process and can be expected to have high efficiency.

BRIEF DESCRIPTION OF THE DRAWINGS

FIG. 1A, FIG. 1B and FIG. 1C are schematic elevational, plane and side sectional views thereof, respectively.

DETAILED DESCRIPTION

An embodiment of the present disclosure resides in a method for manufacturing a semiconductor element comprising a first electrode, a second electrode, an active layer having a perovskite structure, and a substrate, comprising:

forming a coating film by directly or indirectly coating said first or second electrode with a coating solution that contains a precursor compound for the perovskite structure and an organic solvent capable of dissolving said precursor compound, and then forming said active layer by gas-blowing procedure in which a gas is blown onto said coating film before the formation reaction of the perovskite structure is completed in said coating film.

Further, another embodiment of the present disclosure resides in an apparatus for manufacturing a semiconductor element comprising a first electrode, a second electrode, an active layer having a perovskite structure, and a substrate; provided with a nozzle through which a gas is blown onto a coating film formed by directly or indirectly coating said first or second electrode with a coating solution that contains a precursor compound for the perovskite structure and an organic solvent capable of dissolving said precursor compound, a measuring unit with which the part where the gas is blown through said nozzle is observed, and a controlling unit with which the position where the gas is blown through said nozzle and the amount of gas to blow are controlled according to the observation with said measuring unit.

Embodiments will now be explained with reference to the accompanying drawings.

Figure 1A:
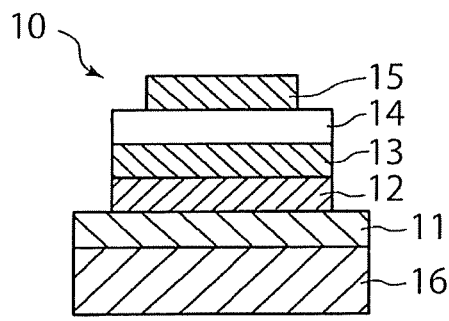
FIG. 1A, FIG. 1B and FIG. 1C schematically show semiconductor elements manufactured according to the embodiment.
Figure 1B:
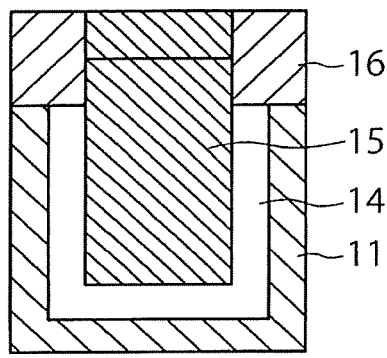
Figure 1C:
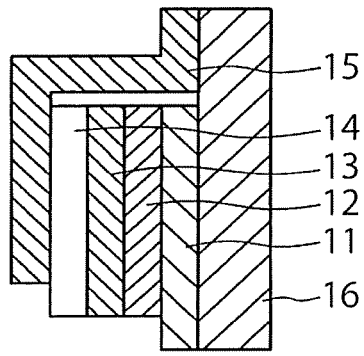

FIGS. 1A to C schematically show an example of the constitution of a photoelectric conversion device 10, which is an embodiment of the semiconductor element manufactured according to the method of the present disclosure. The device comprises a substrate 16, a first electrode 11, a first buffer layer 12, an active layer 13, a second buffer layer 14, and a second electrode 15, stacked in order. The first or second electrode 11 or 15 serves as an anode or a cathode to extract electricity.

The photoelectric conversion layer 13 is excited by light coming through the substrate 16, the first electrode 11 and the first buffer layer 12 or through the second electrode 15 and the second buffer layer 14, and supplies electrons or holes to the first and second electrodes 11 and 15. Each of the first and second buffer layers 12 and 14 is placed between the photoelectric conversion layer and each electrode, and they are not necessarily indispensable in the embodiment. Further, the device may have what is called a back-contact structure, in which both of the first electrode 11 and/or the first buffer layer 12 and the second buffer layer 14 and/or the second electrode 15 are separately placed on the same side of the active layer 13.

In the present disclosure, the "semiconductor element" means a photoelectric conversion device, such as, a solar cell or a sensor, or a light-emitting device. Those devices have the same basic structures although they are different in that the active layer functions as a photoelectric conversion layer or as a light-emitting layer.

[Semiconductor Element]

In order to explain component members of the semiconductor element manufactured according to the embodiment, those of the photoelectric conversion device are exemplified and described below.

(Substrate 16)

The substrate 16 supports other component members. The substrate 16 necessarily has a surface on which electrodes can be formed, and accordingly is preferably not impaired by heat applied thereto or by organic solvents brought in contact therewith when the electrodes are formed thereon. Examples of materials of the substrate 16 include: (i) inorganic substances, such as, non-alkali glass and quartz glass; (ii) organic substances, such as, polyethylene, polyethylene terephthalate (PET), polyethylene naphthalate (PEN), polyimide, polyamide, polyamide-imide, liquid crystal polymer, plastics (e.g., cycloolefin polymers), and polymer films; and (iii) metals, such as, stainless steel (SUS) and silicon.

The substrate 16 may be either transparent or not, and is properly selected according to the structure of the aimed photoelectric conversion device. If the device is so designed that incident light may come from the outer surface of the substrate 16, the substrate is selected to be transparent. However, if the electrode on the opposite side to the substrate 16 is transparent or semitransparent, the substrate does not need to be transparent.

There are no particular restrictions on the thickness of the substrate as long as it has enough strength to support other component members.

If the substrate 16 is placed on the light-incident side, it is possible to provide an antireflection film of, for example, moth-eye structure on the light-incident surface. That structure enables incident light to enter the device efficiently and thereby can improve the energy conversion efficiency of the cell. The moth-eye structure has a surface on which convexes of about 100 nm height are regularly arranged. Because of this convex structure, the refractive index continuously changes along the thickness direction. Accordingly, if the substrate is coated with that antireflective film, the film prevents the refractive index from discontinuous changing. As a result, the film reduces reflection of the incident light and thereby improves the conversion efficiency of the cell.

(First and Second Electrodes)

The first and second electrodes 11 and 15 can be made of materials freely selected from known ones as long as they have electroconductivity. However, the material of the electrode on the light-incident side should be selected from transparent or semitransparent electroconductive substances.

Examples of the transparent or semitransparent electrode materials include electroconductive metal oxide films and semitransparent metal films. Either or both of the first and second electrodes 11 and 15 may have a layered structure of composite materials. Concrete examples of the films usable as the electrodes include: electroconductive glass films (e.g., NESA) comprising, for example, indium oxide, zinc oxide, tin oxide or a composite thereof, such as, indium-tin oxide (ITO), fluorine-doped tin oxide (FTO), or indium-zinc oxide; and films of metals, such as, gold, platinum, silver, and copper. Among them. ITO and FTO films are particularly preferred.

The electrode made of ITO preferably has a thickness of 30 to 300 nm. If the thickness is thinner than 30 nm, the electroconductivity tends to decrease and hence the resistance tends to increase. The increased resistance often lowers the photoelectric conversion efficiency. On the other hand, however, if the thickness is thicker than 300 nm, the ITO film tends to be less flexible. As a result, the thick film often suffers from cracks when stress is applied. The electrode preferably has as small a sheet resistance as possible. Specifically, the sheet resistance is preferably 10 Ω/square or less. The electrode may be a single layer, but it may consist of stacked plural layers made of materials having different work functions.

If formed adjacently to an electron transport layer, the electrode is preferably made of materials having low work functions, such as, alkali metals and alkaline earth metals. Examples thereof include: Li, In, Al, Ca, Mg, Sm, Tb, Yb, Zr, Na, K, Rb, Cs, Ba, and alloys thereof. Further, metals selected from the above materials having low work functions may be alloyed to use with metals selected from those having relatively high work functions, such as, gold, silver, platinum, copper, manganese, titanium, cobalt, nickel, tungsten, and tin. Examples of the alloys usable for the electrode include: lithium-aluminum alloy, lithium-manganese alloy, lithium-indium alloy, manganese-silver alloy, calcium-indium alloy, manganese-aluminum alloy, indium-silver alloy, and calcium-aluminum alloy. The electrode made of those alloys preferably has a thickness of 1 to 500 nm, more preferably 10 to 300 nm. If the thickness is thinner than the above, the resistance often increases too much to transfer a sufficient amount of generated electric charges into the external circuit. On the other hand, if the electrode is too thick, it takes a long time to form the electrode. Accordingly, the electrode material is often exposed to high temperature in such a long time that it may be damaged to deteriorate the performance. In addition, the material is used in a large amount and the film-forming apparatus is operated for a long time, and consequently the production cost tends to increase.

It is also possible to adopt organic materials as the electrode materials. For example, electroconductive polymer compounds, such as polyethylenedioxythiophene (hereinafter, often referred to as "PEDOT"), are preferably employed. Those electroconductive polymer compounds are commercially available, and examples thereof include Clevios PH500, Clevios PH, Clevios P VP Al 4083, and Clevios HIL 1,1 ([trademark], manufactured by H.C, Starck GmbH). PEDOT has a work function (or ionization potential) of 4.4 eV, but can be combined with other materials to control the work function of the electrode. For example, PEDOT is mixed with polyethylene sulfonate salt (hereinafter, often referred to as "PSS") to control the work function in a range of 5.0 to 5.8 eV. However, if electroconductive polymer compounds and other materials are combined to form a layer, the layer may contain the electroconductive polymer compounds in such a relatively small content that it may deteriorate in carrier transportability. In view of that, the electrode thus formed preferably has a thickness of 50 nm or less, more preferably 15 nm or less. Further, if the content of electroconductive polymer compounds is relatively decreased, the electrode tends to repel the coating solution applied thereon to form the perovskite layer because the surface energy changes. Consequently, the resultant perovskite layer may suffer from pinholes formed thereon. In order to avoid them, nitrogen gas or the like is preferably blown onto the coating solution so that the solvent may be completely dried before the solution is repelled. As the electroconductive polymer compounds, polypyrrole, polythiophene and polyaniline are preferably employed.

(Photoelectric Conversion Layer)

The photoelectric conversion layer (active layer) 13 formed by the method of the embodiment has a perovskite structure. Here, the "perovskite structure" means the same crystal structure as perovskite. The perovskite structure typically comprises ions A, B and X where the ion B is smaller than the ion A. The chemical composition of this crystal structure can be represented by the following formula (1):

$$ABX_3 \qquad (1).$$

In the formula, A is a primary ammonium ion, such as, $CH_3NH_3^+$, $C_2H_5NH_3^+$, $C_3H_7NH_3^+$, $C_4H_9NH_3^+$ or $HC(NH_2)_2^+$, and is preferably $CH_3NH_3^+$. The ion B is a divalent metal ion, and is preferably $Pb^{2+}$ or $Sn^{2+}$. The ion X is a halogen ion, which is, for example, selected from $F^-$, $Cl^-$, $Br^-$, $I^-$ or $At^-$, and is preferably $Cl^-$, $Br^-$ or $I^-$. The materials of A, B and X may be individually single substances or mixtures. Even if not strictly satisfying the ratio of $ABX_3$, those ions can fill the roles.

This crystal structure has a unit lattice of, for example, cubic crystal, tetragonal crystal or orthorhombic crystal, and the ions A and B are positioned at vertexes and body centers, respectively. In a cubic lattice in which the ion B is centered, the ion X is positioned at each face center. In this crystal structure, the unit lattice includes an octahedron consisting of one B ion and six X ions. This octahedron interacts with the ions A, and thereby is readily distorted to undergo phase transition into a symmetrical crystal. This phase transition drastically changes the crystal properties, so that electrons or holes are released out of the crystal. In this way, electricity is presumed to be generated.

If the photoelectric conversion layer is thickened, the amount of absorbed light increases and accordingly the short circuit current density (Jsc) is enhanced. On the other hand, however, the carrier transport distance also extends and accordingly loss due to deactivation tends to increase. This means that there is a thickness optimal for obtaining the maximum efficiency, and specifically the thickness is preferably 30 to 1000 nm, more preferably 60 to 600 nm.

Actually, for example, the device according to the embodiment and other common devices can be made to have the same conversion efficiencies under sunlight exposure conditions by individually controlling the thicknesses of their photoelectric conversion layers. However, under the conditions of as low illuminance as 200 lux, the device of the embodiment can realize a higher efficiency than common devices because having the conversion layer different from them in properties.

(First and Second Buffer Layers 12 and 14)

The first or second buffer layer 12 or 14 is placed between the photoelectric conversion layer and the first or second electrode, respectively. If they are provided, one of them serves as a hole transport layer while the other serves as an electron transport layer. Those layers are preferably formed so that the device can achieve high conversion efficiency, but are not necessarily indispensable. Either or both of them may be omitted. Further, either or both of the first and second buffer layers 12 and 14 may have a layered structure of composite materials.

The electron transport layer has a function of transporting electrons efficiently. If serving as the electron transport layer, the buffer layer preferably contains a halogen compound or a metal oxide. Preferred examples of the halogen compound include LiF, LiCl, LiBr, LiI, NaF, NaCl, NaBr, NaI, KF, KCl, KBr, KI and CsF. Among them. LiF is particularly preferred.

Preferred examples of the metal oxide include titanium oxide, molybdenum oxide, vanadium oxide, zinc oxide, nickel oxide, lithium oxide, calcium oxide, cesium oxide, aluminum oxide and niobium oxide. Among them, titanium oxide is preferred. Specifically, it is particularly preferred to adopt amorphous titanium oxide obtained by hydrolysis of titanium alkoxide according to sol-gel method.

Further, the electron transport layer can comprise inorganic materials such as metal calcium.

If formed in the photoelectric conversion device of the embodiment, the electron transport layer preferably has a thickness of 20 nm or less. This is because that thickness lowers the film resistance of the electron transport layer to enhance the conversion efficiency. On the other hand, the thickness can be 5 nm or more. The electron transport layer thicker than a particular thickness can show hole-blocking effect fully enough to prevent generated excitons from deactivating before releasing electrons and holes. As a result of the effect, electric currents can be efficiently extracted.

The n-type organic semiconductor can be employed as a material of the electron transport layer.

As the n-type organic semiconductor, fullerenes and derivatives thereof are preferably adopted but not limited thereto. The derivatives have, for example, basic skeletons of $C_{60}$, $C_{70}$, $C_{76}$, $C_{78}$ and $C_{84}$. In those fullerene derivatives, carbon atoms in the fullerene skeletons may be modified with desired functional groups, which may combine with each other to form rings. The fullerene derivatives include fullerene polymers. The fullerene derivatives preferably contain functional groups having such high affinity to solvents that they can have high solubility therein.

Examples of the functional groups in the fullerene derivatives include: hydrogen; hydroxyl; halogen atoms, such as, fluorine and chlorine; alkyl groups, such as, methyl and ethyl; alkenyl groups, such as, vinyl; cyano; alkoxy groups, such as, methoxy and ethoxy; aromatic hydrocarbon groups, such as, phenyl and naphthyl; and aromatic heterocyclic groups, such as, thienyl and pyridyl. Concrete examples of the n-type organic semiconductor include: hydrogenated fullerenes of $C_{60}H_{36}$ and $C_{70}H_{36}$, oxide fullerenes of $C_{60}$ and $C_{70}$, and fullerene metal complexes.

Among the above, it is particularly preferred to use [60]PCBM ([6,6]-phenyl$C_{61}$butyric methyl ester) or [70]PCBM ([6,6]-phenyl$C_{71}$butyric methyl ester) as the fullerene derivative.

Further, as the n-type organic semiconductor, it is also possible to use a low molecular-weight compound capable of forming a film by vapor deposition. Here, the "low molecular-weight compound" means a compound whose number- and weight-average molecular weights (Mn and Mw) are the same. One of them is 10,000 or less. It is particularly preferred to adopt BCP (bathocuproine), Bphen (4,7-diphenyl-1,10-phenanthroline), TpPyPB (1,3,5-tri (p-pyrid-3-yl-phenyl) benzene) or DPPS (diphenyl bis(4-pyridin-3-yl)phenyl)silane).

The hole transport layer has a function of transporting holes efficiently. If serving as the hole transport layer, the buffer layer can contain a p-type or n-type organic semiconductor material. Here, the "p-type or n-type organic semiconductor" means a substance capable of serving as an electron donor or acceptor material when used in formation of a hetero- or bulkhetero-junction.

The p-type organic semiconductor can be employed as a material of the hole transport layer.

For example, the p-type organic semiconductor preferably contains a copolymer comprising a donor unit and an acceptor unit. It is possible to use fluorine, thiophene and the like as the donor unit. As the acceptor unit, benzothiadiazole and the like can be used. Examples of the material usable for the hole transport layer include: polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinyl carbazole and derivatives thereof, polysilane and derivatives thereof, polysiloxane derivatives having aromatic amines in their main or side chains, polyaniline and derivatives thereof, phthalocyanine derivatives, porphyrin and derivatives thereof, polyphenylenevinylene and derivatives thereof, polythienylenevinylene and derivatives thereof, benzodithiophene and derivatives thereof, and thieno[3,2-b]-thiophene and derivatives thereof. Those materials may be combined to use for the hole transport layer. Further, it is also possible to use copolymers composed of comonomers constituting the above materials. Among the above, polythiophene and derivatives thereof are preferred because they have excellent steric regularity and relatively high solubility in solvents.

Furthermore, the hole transport layer may be formed by use of derivatives of copolymer containing carbazole, benzothiadiazole and thiophene. Examples of those derivatives include poly[N-9'-heptadecanyl-2,7-carbazole-alt-5,5-(4',7'-di-2thienyl-2',1',3'-benzothiadiazole)] (hereinafter, often referred to as "PCDTBT). In addition, also preferred are copolymers of benzodithiophene (BDT) derivatives and thieno[3,2-b]thiophene derivatives. Preferred examples thereof include: poly[4,8-bis[(2-ethylhexyl)oxy]benzo[1,2-b:4-5-b']dithiophene-2,6-dyl][3-fluoro-2-[(2-ethylhexyl)carbonyl]thieno[3,4-b]-thiophenedyl]] (hereinafter, often referred to as "PTB7"); and PTB7-Th (often referred to as "PCE10" or "PBDTTT-EFT"), which contains thienyl group having weaker electron donatability than the alkoxy group in PTB7. Still further, it is still also possible to adopt metal oxide as the material of the hole transport layer. Preferred examples of the metal oxide include titanium oxide, molybdenum oxide, vanadium oxide, zinc oxide, nickel oxide, lithium oxide, calcium oxide, cesium oxide and aluminum oxide. They have the advantage of being inexpensive. As the material of the hole transport layer, thiocyanates such as copper thiocyanate are also employable.

The above p-type organic semiconductors and other transport layer materials, such as spiro-OMeTAD, can be doped with dopants. Examples of the dopants include: oxygen, 4-tert-butylpyridine, lithium-bis(trifluoromethanesulfonyl) imide (Li-TFSI), acetonitrile, tris[2-(1H-pyrazole-1-yl)pyridine]cobalt (III) tris(hexafluorophosphate) (commercially available under the trade name of "FK102 [trademark]"), and tris[2-(1H-pyrazole-1-yl)pyrimidine]cobalt (III) tris[bis (hexafluoromethyl-sulfonyl)imide) (MY11).

The hole transport layer can be formed by use of electroconductive polymer compounds, such as, polyethylenedioxythiophene. The electroconductive polymer compounds described above for the electrodes are also employable. Also as for the hole transport layer, polythiophene-type polymers such as PEDOT can be combined with other compounds to prepare a material having a work function suitable for transporting holes. Specifically, the work function of the hole transport layer is preferably controlled to be lower than the valence band of the aforementioned active layer.

Thus, the constitution of the photoelectric conversion device manufactured according to the embodiment is explained in the above description. The aforementioned active layer having a perovskite structure can function also as a light-emitting layer. Accordingly, not only photoelectric conversion devices but also light-emitting devices can be produced according to the below-described method for manufacturing semiconductor elements. In the embodiment, therefore, they are altogether referred to as "semiconductor elements".

[Method for Manufacturing Semiconductor Elements]

The semiconductor element-manufacturing method according to the embodiment is characterized by the procedures for forming an active layer having a perovskite structure. There are no particular restrictions on the materials and formation processes of the substrate, the first and second electrodes and the buffer layers optionally formed thereon. The method of the embodiment for manufacturing semiconductor elements are explained below.

First, the first electrode is provided on the substrate. The electrode can be formed by any process, which is selected from vacuum deposition, sputtering, ion-plating, normal plating, wet-coating or the like.

Subsequently, according to necessity, the buffer layer or an undercoat layer is formed thereon. The buffer layer can be also formed by a process selected from vacuum deposition, sputtering, ion-plating, normal plating, wet-coating or the like. However, the undercoat layer is normally formed by wet-coating.

The active layer is then formed on the electrode directly or via the buffer layer or the undercoat layer.

In the method of the embodiment, the active layer is formed by a wet-coating process. Specifically, the first or second electrode is coated with a coating solution that contains a precursor compound for the perovskite structure and an organic solvent capable of dissolving the precursor compound, to form a coating film.

There are no particular restrictions on the solvent used in the coating solution as long as it can dissolve the material. Examples of the solvent include N,N-dimethylformamide (DMF) and γ-butyrolactone.

The coating solution can be prepared by dissolving two or more starting materials for forming a perovskite structure in a solvent. Otherwise, two or more starting materials for forming a perovskite structure may be individually dissolved in solvents, and then the obtained solutions are one-by-one cast by means of coating machine, such as, spin coater, slit coater, bar coater, or dip coater.

The coating solution may contain additives. Preferred examples of the additives include 1,8-diiodooctane (DIO) and N-cyclohexyl-2-pyrrolidone (CHP).

It is generally known that, if the element structure includes a mesoporous structure therein, leak currents between the electrodes are reduced even when pinholes, cracks and/or voids are formed in the active layer. This effect can hardly be obtained if the element structure includes no mesoporous structure therein. However, if the coating solution in the embodiment contains plural materials for the perovskite structure, the active layer less undergoes volume shrinkage in its formation and consequently the obtained layer tends to have a small amount of pinholes, cracks and/or voids. In addition, if another solution containing methylammonium iodide (MAI), metal halogen compounds and the like is further cast thereon after the coating solution is applied, reactions with unreacted metal halogen compounds proceed and consequently the obtained layer tends to have a much smaller amount of pinholes, cracks and/or voids. It is, therefore, preferred to coat the active layer with the MAI-containing solution after the coating solution is cast thereon. The MAI solution is preferably applied after the gas-blowing procedure described below.

(Gas-Blowing)

In the method of the embodiment, it is necessary to make the reaction of forming the perovskite structure proceed rapidly in the coating film. In order to accelerate the reaction, the coating film is blown with a gas.

There are no particular restrictions on the kind of the gas. Preferred examples of the gas include nitrogen and rare gases such as helium, neon and argon. It is also possible to adopt air, oxygen or carbon dioxide. Those gases can be used singly or in a mixture. Nitrogen gas is preferred because it is inexpensive and can be isolated to use from air. The gas contains water in an amount of normally 50% or less, preferably 4% or less. On the other hand, the lower limit of the water content is preferably 10 ppm.

The gas is preferably kept at 30° C. or below. According as the gas temperature rises, the materials of the perovskite structure become more soluble in the coating solution and hence it becomes difficult to form the perovskite structure.

On the other hand, the temperature of the substrate is preferably lower than that of the gas. Specifically, it is preferably 20° C. or below, more preferably 15° C. or below.

The procedure of gas-blowing can sufficiently accelerate the perovskite structure-forming reaction without annealing. The mechanism thereof is not revealed in detail, but the reaction is presumed to be spontaneously promoted to crystallize the perovskite structure. The solvent is also presumed to be removed on the way to formation of the perovskite structure. The gas-blowing procedure drives the reaction to form the perovskite structure without heating, and thereby inhibits pinholes, cracks and/or voids. Further, since not exposed to heat, the surface of the coating film is not quickly dried and hence the difference of stress is reduced between the surface and the inside of the film. Accordingly, the resultant active layer has a surface smooth enough to improve the fill factor and the lifetime.

The gas-blowing procedure must be carried out before the reaction is completed to form the perovskite structure in the coating solution. This means that the reaction must be promoted by gas-blowing. It is preferred to start gas-blowing immediately after the coating solution is cast to form a film. Specifically, it starts preferably within 10 seconds, more preferably with 1 second. While the coating solution is being dried, crystals of simple substances, such as MAI and lead iodide, contained as the materials may grow simultaneously with formation of the perovskite structure. The sooner the materials dissolved or dispersed in the coating solution are dried, the more efficiently the perovskite structure can grow. The method of the embodiment is effective in forming the perovskite structure on an organic film or on an oxide having large lattice mismatch.

The progress of the reaction can be monitored by use of an absorption spectrum of the coating solution or film. Specifically, the light transmittance decreases in accordance with formation of the perovskite structure. In fact, the coating film can be seen to become brown in color according as the reaction proceeds. In order to quantitatively observe the color change, the absorption spectrum of the coating film is measured. The absorption spectrum is preferably measured in such a wavelength range that absorption by the perovskite structure can be clearly observed but that absorption by the materials in the coating solution does not disturb the observation. Specifically, the absorption spectrum is preferably measured in 700 to 800 nm. However, it is not necessary to measure the spectrum in the whole wavelength range, and it is enough to observe the absorption at a particular wavelength, for example, at 800 nm.

If the substrate and the electrode are transparent, the absorption spectrum can be measured by use of transmitted light when the coating solution is cast. If they are not sufficiently transparent, light reflected by the surface of the coating film is observed to measure the spectrum.

In the method according to the embodiment, the gas-blowing procedure is started before the reaction is completed to form the perovskite structure. When the formation reaction is completed, the procedure is stopped. The reaction is regarded as completed when the absorption spectrum in 700 to 800 nm does not change. On the other hand, it is preferred to start the gas-blowing procedure as soon as possible after the coating solution is cast. The sooner the procedure is started, the more homogeneously the perovskite structure is formed and hence the more the performance of the device is improved.

The time of gas-blowing is preferably 45 second or more, further preferably 120 seconds or more if the coating solution containing the materials for forming the perovskite structure is in contact with an organic material-containing layer, which is, for example, the first electrode 11, the first buffer layer 12, the second buffer layer 14, the second electrode 15, or the undercoat layer described later.

The gas is preferably so blown as to flow fast near the surface of the coating film. Specifically, the gas is generally blown through a nozzle, whose tip is preferably pointed toward the coating surface and also preferably positioned near the coating surface.

The flow velocity of the gas is preferably controlled to obtain the effects of the embodiment. The gas is preferably made to flow fast near the surface of the coating film because the reaction tends to proceed rapidly to form the perovskite structure. However, in view of avoiding tremors on the film surface caused by the gas flow, the flow is preferably slow.

After the procedure of gas-blowing, the coating solution containing a precursor compound for the perovskite structure may be further cast once or more again. It can be carried out by means of spin coater, slit coater, bar coater, or dip coater. The solution is preferably so cast as to form a relatively thin film because the active layer formed from the first coating solution tends to be a lattice mismatch layer. Specifically, the thin film is preferably formed under such a condition that the spin coater is rotated at a relatively high speed, that the slit or bar coater is used with a relatively narrow slit, that the dip coater is used at a relatively high pulling-up speed or that the coating solution contains the solutes in a relatively low concentration.

Meanwhile, also in a conventional method called "2-step method" or "sequential deposition method", the coating film is blown with a gas after the reaction is completed to form a perovskite structure, that is, after the coating film is completely colored. However, that procedure is carried out only for the purpose of drying the solvent component. If the element includes a mesoporous structure or comprises an undercoat layer of titanium oxide or aluminum oxide, they may promote crystallization of the perovskite structure and hence the gas-blowing procedure has some effect in the conventional method. However, it has little effect on the reaction for forming a perovskite structure on an organic film or on an oxide having large lattice mismatch. As described above for the embodiment, if the perovskite structure is intended to be formed on an organic film or on an oxide having large lattice mismatch, the coating film is blown with a gas before the reaction is completed to form the perovskite structure, so as to promote the reaction and thereby to inhibit structural defects, such as pinholes, cracks and voids.

(Undercoat Layer)

Before the active layer having a perovskite structure is formed, it is possible to form an undercoat layer on the electrode in addition to or in place of the first or second buffer layer.

The undercoat layer preferably contains a low molecular weight compound. Here, the "low molecular weight compound" means a compound whose number- and weight-average molecular weights Mn and Mw are the same and 10,000 or less.

Examples thereof include: organic sulfur compounds, organic selenium and tellurium compounds, nitrile compounds, mono-alkylsilanes, carboxylic acids, phosphoric acids, phosphoric esters, organic silane compounds, unsaturated hydrocarbons, alcohols, aldehydes, alkyl bromides, diazo compounds, and alkyl iodides. For example, 4-fluorobanzoic acid (FBA) is preferred.

The undercoat layer can be formed by casting and drying a coating solution containing the low molecular weight compound described above. The undercoat layer is effective in that the carrier collection efficiency from the perovskite layer to the electrodes can be improved by the action of vacuum level shift caused by dipoles, in that the perovskite layer can be improved in crystallizability, in that formation of pinholes can be inhibited in the perovskite layer, and in that incident light can be more transmitted through the light-receiving surface. As a result, the current density is increased and the fill factor is improved, and accordingly the photoelectric conversion efficiency and the luminous efficiency are enhanced. Particularly when the perovskite structure is formed on the electrode or on the buffer layer of large lattice mismatch-containing crystal system other than titanium oxide or aluminum oxide, the undercoat layer is provided to function by itself as a stress relaxation layer or to give the stress relaxation function to the perovskite structure in a part near the undercoat layer. Thus, the undercoat layer not only improves crystallizability of the perovskite layer but also relaxes the inner stress generated by crystal growth to inhibit pinholes and to realize excellent interface bonding.

Further, it is also possible to form an undercoat layer having a mesoporous structure or comprising titanium oxide or aluminum oxide. That undercoat layer can reduce leak currents between the electrodes even if pinholes, cracks and voids are formed in the active layer. However, the method of the embodiment is not limited to such semiconductor element and suitably used for a planar-type element not provided with that kind of undercoat layer.

(Protective Layer)

After the active layer having a perovskite structure is formed, it is possible to form a protective layer on the surface thereof in addition to or in place of the first or second buffer layer.

The material of the protective layer is not particular limited as long as the undulated structure formed on the surface can be polished to scrape the swelling parts thereof. Examples thereof include halogen compounds, inorganic oxides, organic low-molecular weight substances, and polymers. The protective layer preferably has carrier transport-ability because it can also serve as the first or second buffer layer. For that protective layer, the aforementioned materials of the first or second buffer layer 12 or 14 can be employed.

(Polishing Method)

Immediately after the active layer or the protective layer is formed, the surface thereof is preferably polished. The polishing procedure is carried out for the purpose of smoothing the surface of the formed layer. Particularly if carried out after the protective layer is formed, the polishing procedure is preferably operated so that the active layer only in the swelling parts can be bared.

There are no particular restrictions on the method of polishing and also on the abrasive used therein. Examples of the abrasive include abrasives according to JIS R6111, such as, brown alumina abrasive, white alumina abrasive, rose-pink alumina abrasive, pulverized alumina abrasive, artificial emery abrasive, alumina zirconia abrasive, black silicon carbide abrasive, and green silicon carbide abrasive. The size of abrasive grains is, for example, #240, #280, #320, #360, #400, #500, #600, #700, #800, #1000, #1200, #1500, #2000, #2500, or #3000. Those are described in JIS R6001. Further, nonwoven cloth and sponge of polyvinyl alcohol are also employable.

[Apparatus for Manufacturing Semiconductor Elements]

Figure 2:
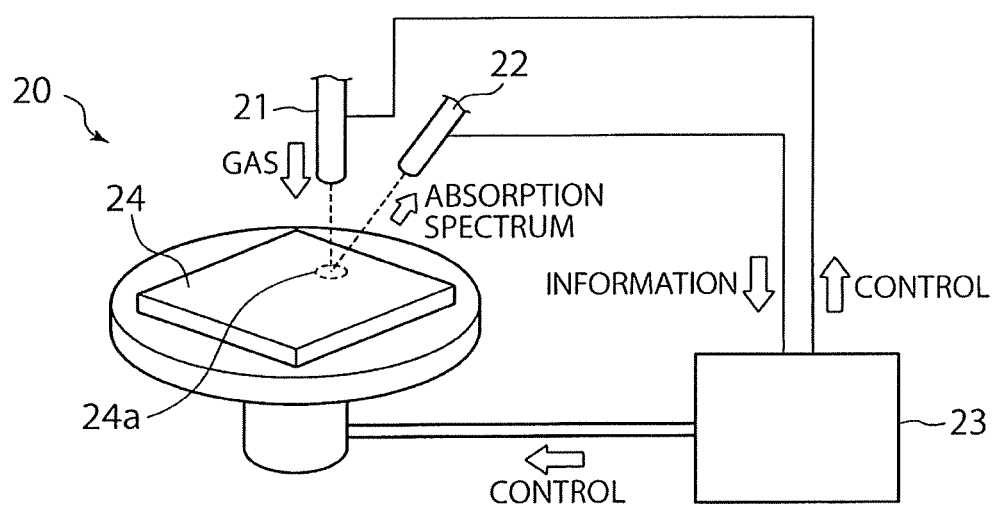
FIG. 2 schematically shows the structure of an apparatus according to the embodiment for manufacturing semiconductor elements.

The apparatus according to the embodiment is used for the purpose of manufacturing the aforementioned semiconductor elements. FIG. 2 schematically shows an example of the semiconductor element-manufacturing apparatus 20 according to the embodiment.

The apparatus is provided with
(i) a nozzle 21 through which a gas is blown onto a coating film 24 formed on an electrode or the like,
(ii) a measuring unit 22 with which the part 24a where the gas is blown is observed particularly in order to monitor progress of the reaction for forming a perovskite structure, and
(iii) a controlling unit 23 with which the position where the gas is blown through the nozzle and the amount of gas to blow are controlled according to the observation with the measuring unit.

The nozzle 21 may be in any shape, but is preferably in such a shape that the gas-flow velocity near the coating film surface can be properly controlled. The gas is preferably made to flow fast near the surface of the coating film because the reaction tends to proceed rapidly to form the perovskite structure. However, in view of avoiding tremors on the film surface caused by the gas flow, the flow is preferably slow.

Examples of the nozzle include a straight spraying nozzle, a conical spraying nozzle, and a fan spraying nozzle.

The nozzle tip is preferably pointed toward the coating surface and also preferably positioned near the surface so that the gas may flow fast near the surface.

Figures 3, 4:
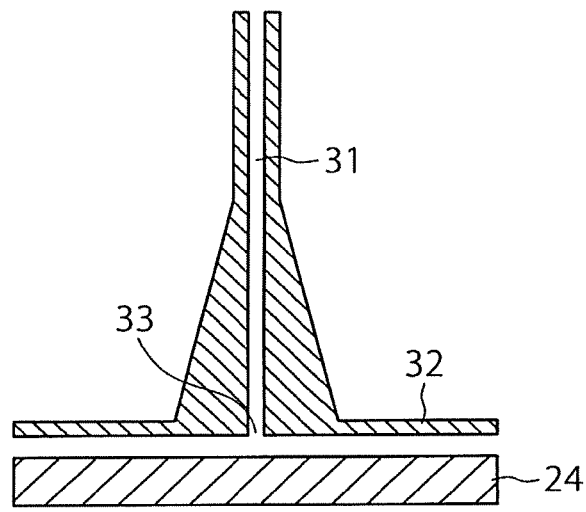
FIG. 3 is a schematic sectional view of a nozzle used in the embodiment.
FIG. 4 is a schematic sectional view of the element of Example 1.

In order to obtain further preferred effects, the nozzle preferably comprises a pipe 31 and a flange 32 (gas-flow guide), shown in FIG. 3. The flange 32 and the coating film 24 form a space between them, and the gas flows in the space. Because of this space, the gas-flow velocity can be surely kept fast enough even if the gas outlet 33 is positioned far away. Thus, it is possible to control the gas-flow velocity in the whole coating surface with a limited amount of the gas, and consequently the effects of the embodiment can be obtained in a large area of the coating surface. The apparatus may have two or more nozzles.

The measuring unit 22 is provided for the purpose of observing the part 24a onto which the gas is blown. By means of the measuring unit 22, progress of the reaction for forming a perovskite structure is monitored. Specifically, the reaction is promoted by the gas-blowing procedure, but it is no longer necessary when the reaction is completed. The measuring unit 22, therefore, obtains information of how much the reaction proceeds, and sends it to the controlling unit 23. According to the information, the controlling unit 23 stops blowing the gas from the nozzle or otherwise moves the nozzle or rotates the substrate so as to change the part blown with the gas to another part where the reaction proceeds insufficiently. Since the progress of the reaction can be monitored with the absorption spectrum as described above, the measuring unit 22 is preferably equipped with an absorption spectrometer. Further, since observing the part onto which the gas is blown from the nozzle, the measuring unit 22 is also preferably unified with the nozzle 21 to be compact. The measuring unit 22 may also observe the thickness of the coating film and/or smoothness thereof as well as the progress of the reaction.

It is preferred to stop blowing the gas after the reaction is completed to form the perovskite structure. However, for the purpose of improving the productivity, it is possible to stop blowing before the reaction is completed. That is because the perovskite structure is basically formed when the reaction proceeds by 70% or more. Even if the gas-blowing procedure is ceased on the way, the basically formed structure is not seriously impaired in homogeneity. Accordingly, when the reaction proceeds to a degree, the part blown with the gas may be controlled to be changed. The surface of the film may be thus scanned.

The apparatus according to the embodiment necessarily comprises the above three component members. Although used for the purpose of blowing the gas onto the coating film, the apparatus may further comprise a substrate holder in which the substrate is fixed and a coating unit with which the coating solution is applied.

Further, the apparatus may be combined with another apparatus in which other component members of the semiconductor element, such as the electrodes, are formed on the substrate.

EXAMPLES

In conventional evaluation tests of elements comprising perovskite structures, the power generation areas of evaluated samples were as small as about 2 mm squares. The elements comprising perovskite structures are generally produced in film-forming processes including reactions of crystal growth, and hence have problems in that inner stress is induced by volume shrinkage to generate pinholes or to cause intercoat adhesion failures. For that reason, it was difficult to produce layered structures having small amounts of structural defects. Accordingly, in mass-production processes, conversion efficiencies of the products were poor in reproducibility and varied in a wide range. Although there were some cases where a portion of the products happened to have defects fortuitously in small amounts and to show irregularly high conversion efficiencies, it was difficult to obtain high conversion efficiencies regularly and widely.

However, in view of practical use, it is necessary to manufacture elements capable of realizing high conversion efficiencies in wide ranges. In the following examples, therefore, elements having power generation areas of 1 mm squares were produced and evaluated. In a normal solar cell-manufacturing process including a coating procedure, cells in shapes of 1 cm-width strips are sequentially arranged. Accordingly, the elements having power generation areas of 1 mm squares are suitable in size for serving as samples of practical module performance.

First Examples

Figure 5:
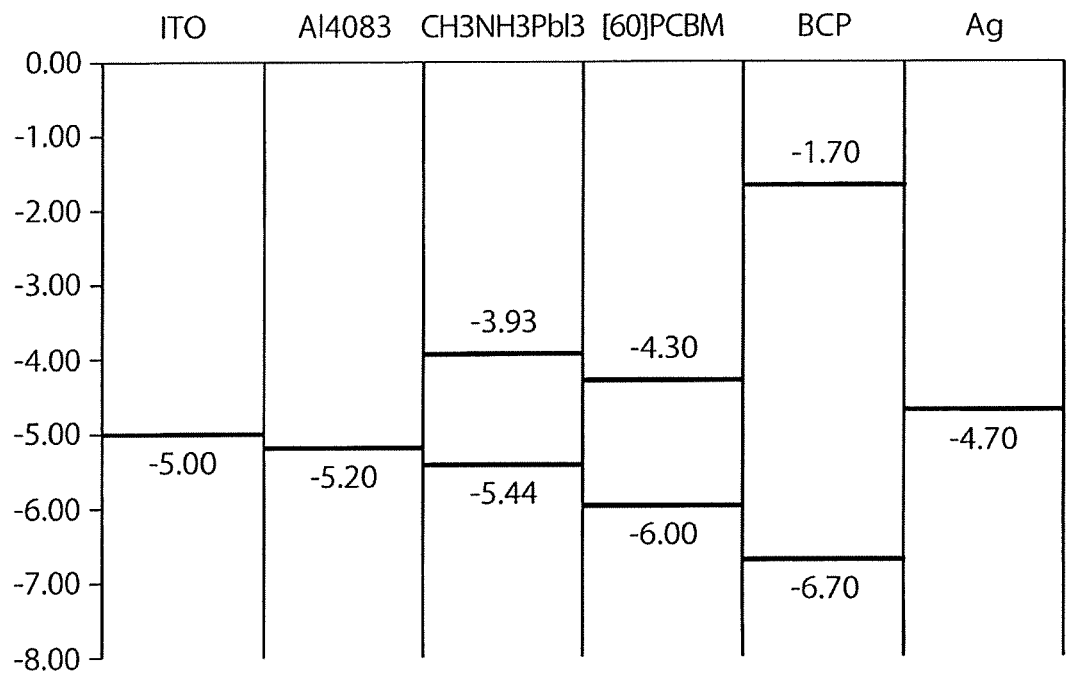
FIG. 5 is an energy diagram of the elements in the first examples.

Elements having the structure shown in FIG. 4 were produced. FIG. 5 shows an energy diagram thereof. First, an ITO film as the first electrode was formed on a glass substrate, and an undercoat layer containing PEDOT:PSS was then formed thereon. The PEDOT:PSS layer was intended to serve also as a hole transport layer. For forming the PEDOT:PSS layer, A14083 ([trademark], manufactured by Heraeus GmbH) was spin-coated at 4000 rpm and then dried at 150° C. for 10 minutes. Thereafter, a perovskite layer comprising methylammonium iodide and lead iodide was formed as the active layer. A coating solution containing a precursor for the perovskite layer was prepared by dissolving methylammonium iodide and lead iodide in DMF so that the contents of methylammonium iodide and lead iodide might be 200 mg/ml and 578 mg/ml, respectively. The solution was spin-coated on the undercoat layer at 5000 rpm.

After the solution was cast, gas-blowing was started before the absorption spectrum of the coating film changed into that of the perovskite structure. When the absorption spectrum of the perovskite structure was observed, gas-blowing was stopped. In the gas-blowing procedure, nitrogen gas was blown in an amount of 8 L/minute from a nozzle having an inner diameter of 7.2 mm. The nozzle was placed so that the nozzle tip was positioned on the normal line at the center of the substrate and in a distance of 7.2 cm from the substrate. The blowing time was 45 seconds.

Subsequently, PCBM was dissolved in cyclobenzene (CB) so that the content thereof might be 20 mg/ml to prepare a solution, which was then spin-coated on the formed active layer at 5000 rpm. Further, a layer of BCP was formed thereon by vacuum deposition. Those layers of PCBM and BCP were intended to be a buffer layer functioning as an electron transfer layer.

After that, the buffer layer was coated with Ag by vacuum deposition to form a second electrode. In this way, an element of Example 1A was produced.

Figure 6:
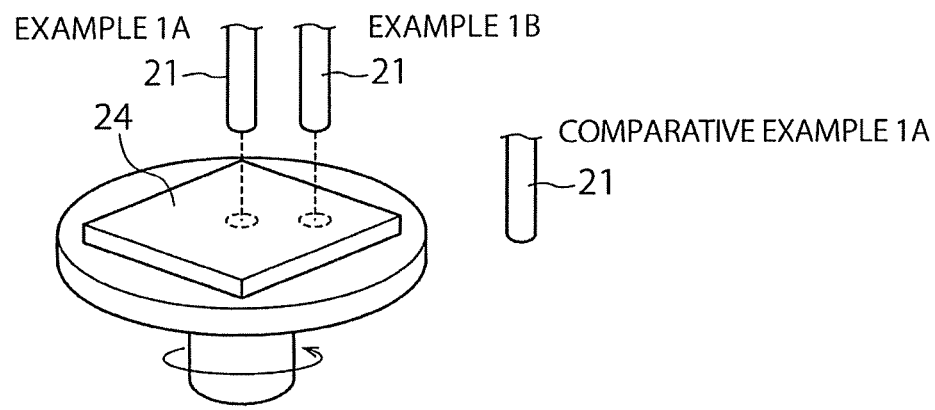
FIG. 6 schematically shows the position of the nozzle in the apparatus for manufacturing semiconductor elements.

The above procedures were repeated except that the position of the nozzle was changed in the gas-blowing procedure, to produce elements. Specifically, the nozzle was placed on the normal line of the substrate but at a position deviated from the center (Example 1B), or the nozzle tip was pointed toward a position where the substrate surface was not laid (Comparative example 1A). Further, another element was produced without carrying out gas-blowing (Comparative example 1B). Those positions of the nozzle were schematically shown in FIG. 6.

Figure 7:
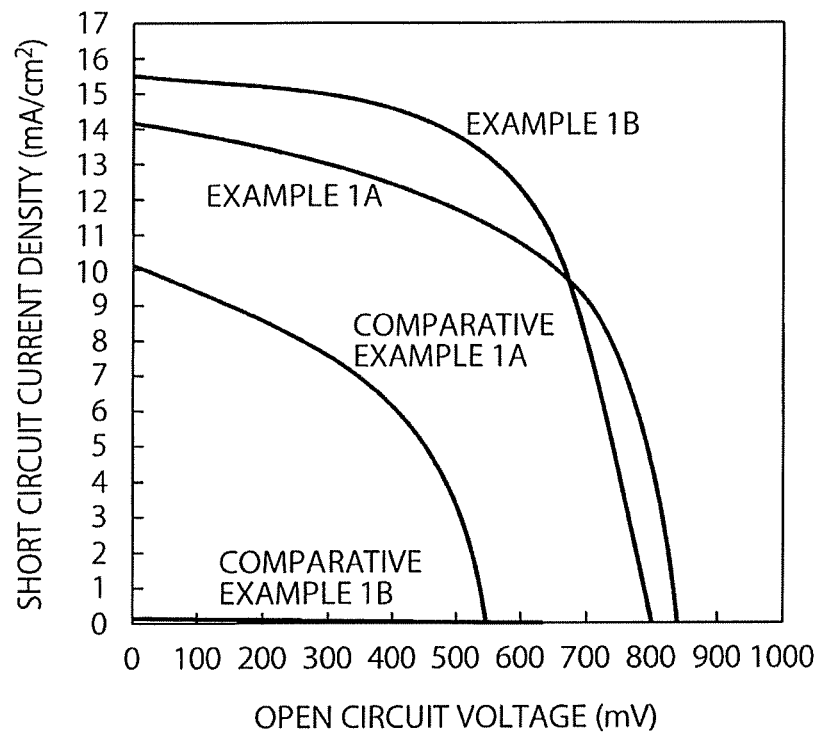
FIG. 7 is an I-V diagram of the elements in the first examples.

The I-V characteristics of the produced elements were measured by means of a solar simulator under the conditions of AM 1.5 and 1000 mW/cm$^2$. The results are shown in Table 1 and FIG. 7.

TABLE 1

|  | Ex. 1A. | Ex. 2B | Com. 1A | Com. 1B |
| --- | --- | --- | --- | --- |
| Voc (mV) | 840 | 796 | 547 | 607 |
| Jsc (mA/cm$^2$) | 14.3 | 15.6 | 10.2 | 0.1 |
| Pmax (mW) | 6.66 | 7.47 | 2.51 | 0.02 |
| FF | 0.56 | 0.60 | 0.45 | 0.18 |
| η (%) | 6.66 | 7.47 | 2.51 | 0.01 |
| Psh (Ω) | 284 | 469 | 128 | 3206 |
| Ps (Ω) | 9.8 | 10 | 16 | 8659 |

The conversion efficiencies of Example 1A, Example 1B, Comparative example 1A and Comparative example 1B were 6.66%, 7.47%, 2.51% and 0.01%, respectively.

Elements were produced under the conditions of Example 1B or Comparative example 1B, and the dispersion of the conversion efficiencies thereof was evaluated.

Four elements were produced under the conditions of Comparative example 1B, and the efficiencies thereof were measured to find that only one of the four elements had a high conversion efficiency. On the other hand, four elements were produced under the conditions of Example 1B, and the efficiencies thereof were measured to find that all the four elements had high conversion efficiencies. Accordingly, it was verified that, when elements having power generation areas of 1 mm squares are manufactured, the gas-blowing procedure makes it possible to produce them reproducibly.

Second Examples

Figure 8:
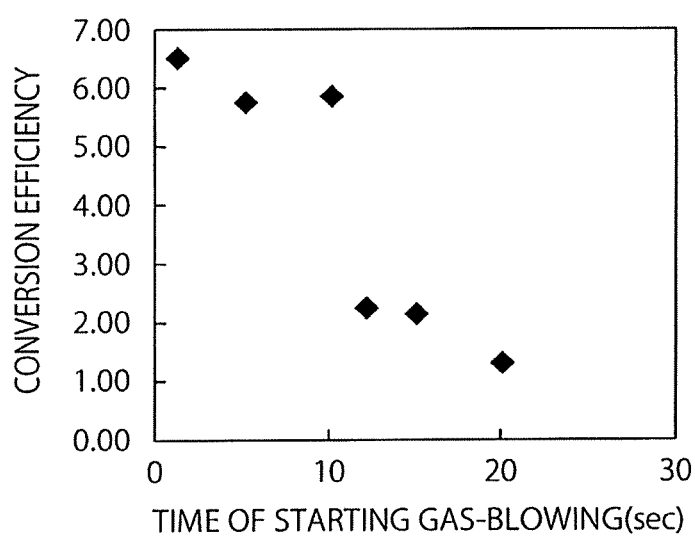
FIG. 8 shows relations between the conversion efficiency and the time of starting gas-blowing in the elements of the second examples.

The procedures of Example 1A were repeated except for the following point. Immediately after coated with the active layer, the substrate was placed on a spin-coater. While being rotated, the substrate was blown with the gas. The time from when the substrate started to rotate on the spin-coater to when the gas-blowing procedure started was changed, to produce elements. The characteristics of the obtained elements are shown in Table 2 and FIG. 8, from which it was found that high conversion efficiencies can be obtained if the coating procedure starts within 10 seconds from the start of rotation. As shown in Table 2, the values of FF were particularly improved. This means that the perovskite layers were improved in quality. It was thus verified that, the sooner the gas-blowing procedure starts after the coating solution is cast, the higher convention efficiency the produced element has.

TABLE 2

|  | Ex. 2A | Ex. 1B | Ex. 2C | Ex. 2D | Ex. 2E | Ex. 2F |
| --- | --- | --- | --- | --- | --- | --- |
| Time of starting gas-blowing (sec) | 1 | 5 | 10 | 12 | 15 | 20 |
| Voc (mV) | 730 | 777 | 778 | 665 | 723 | 730 |
| Jsc (mA/cm$^2$) | 14.7 | 14.6 | 14.1 | 8.8 | 7.9 | 5.1 |
| Pmax (mW) | 6.58 | 5.81 | 5.89 | 2.29 | 2.21 | 1.35 |
| FF | 0.61 | 0.51 | 0.53 | 0.39 | 0.39 | 0.36 |
| η (%) | 6.58 | 5.81 | 5.89 | 2.29 | 2.21 | 1.35 |
| Psh (Ω) | 461 | 219 | 246 | 132 | 156 | 213 |
| Ps (Ω) | 10 | 13 | 13 | 26 | 30.7 | 63.1 |

Third Examples

Figure 9:
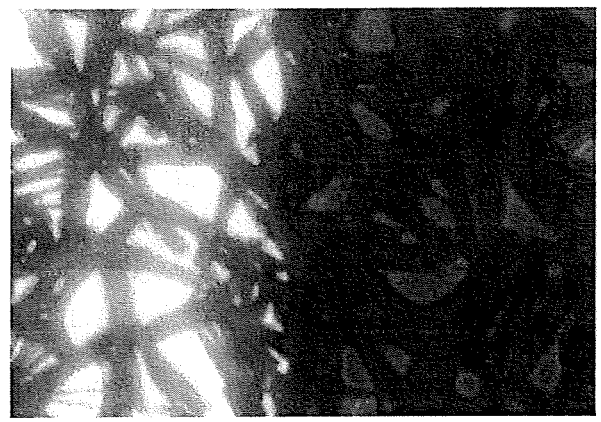
FIG. 9 is a photomicrograph of the element in Comparative example 3.

The procedures of Example 1A were repeated until the step of forming the PCBM layer, to prepare samples. By use of the samples, it was observed what differences in surface conditions were made by whether or not the perovskite layers were blown with the gas. The measurement was carried out by means of 3D laser scanning confocal microscope (VK-X type [trademark], manufactured by Keyence Corporation). As a result, it was found that the sample subjected to gas-blowing (Example 3) had a surface having a high difference of 1.0 to 2.54 µm and that the sample not subjected to gas-blowing (Comparative example 3) had a surface having a high difference of 1.5 to 4.4 µm. Accordingly, it was verified that the surface is smoothened by gas-blowing. Further, it was also found that the surface not subjected to gas-blowing had many dimples having smooth surfaces. The areas near those dimples were observed with an optical microscope (to obtain a transmission image), and thereby they were found to be spots where transmitted light was brightly seen as shown in FIG. 9. This means that they were pinholes on the perovskite layer.

Figure 10:
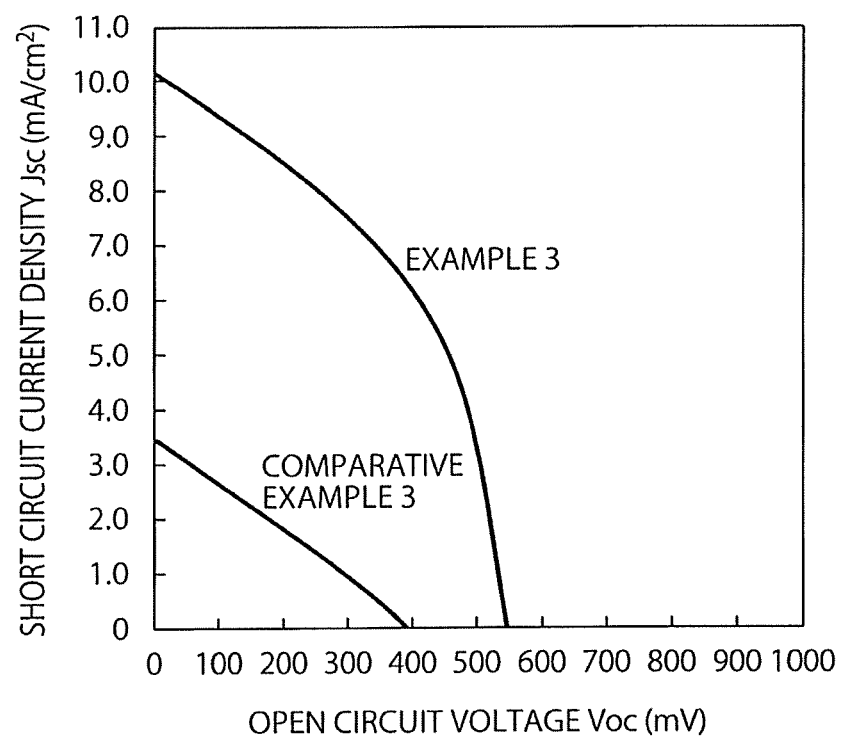
FIG. 10 is an I-V diagram of the elements in the third examples.

The samples were processed to produce finished elements, whose I-V characteristics and conversion efficiencies are shown in Table 3 and FIG. 10.

TABLE 3

|  | Ex. 3 | Com. 3 |
| --- | --- | --- |
| Voc (mV) | 547 | 391 |
| Jsc (mA/cm$^2$) | 10.2 | 3.5 |
| Pmax (mW) | 2.51 | 0.38 |
| FF | 0.45 | 0.27 |
| η (%) | 2.51 | 0.37 |
| Psh (Ω) | 128 | 120 |
| Ps (Ω) | 16.3 | 93.7 |

Fourth Examples

Figure 11:
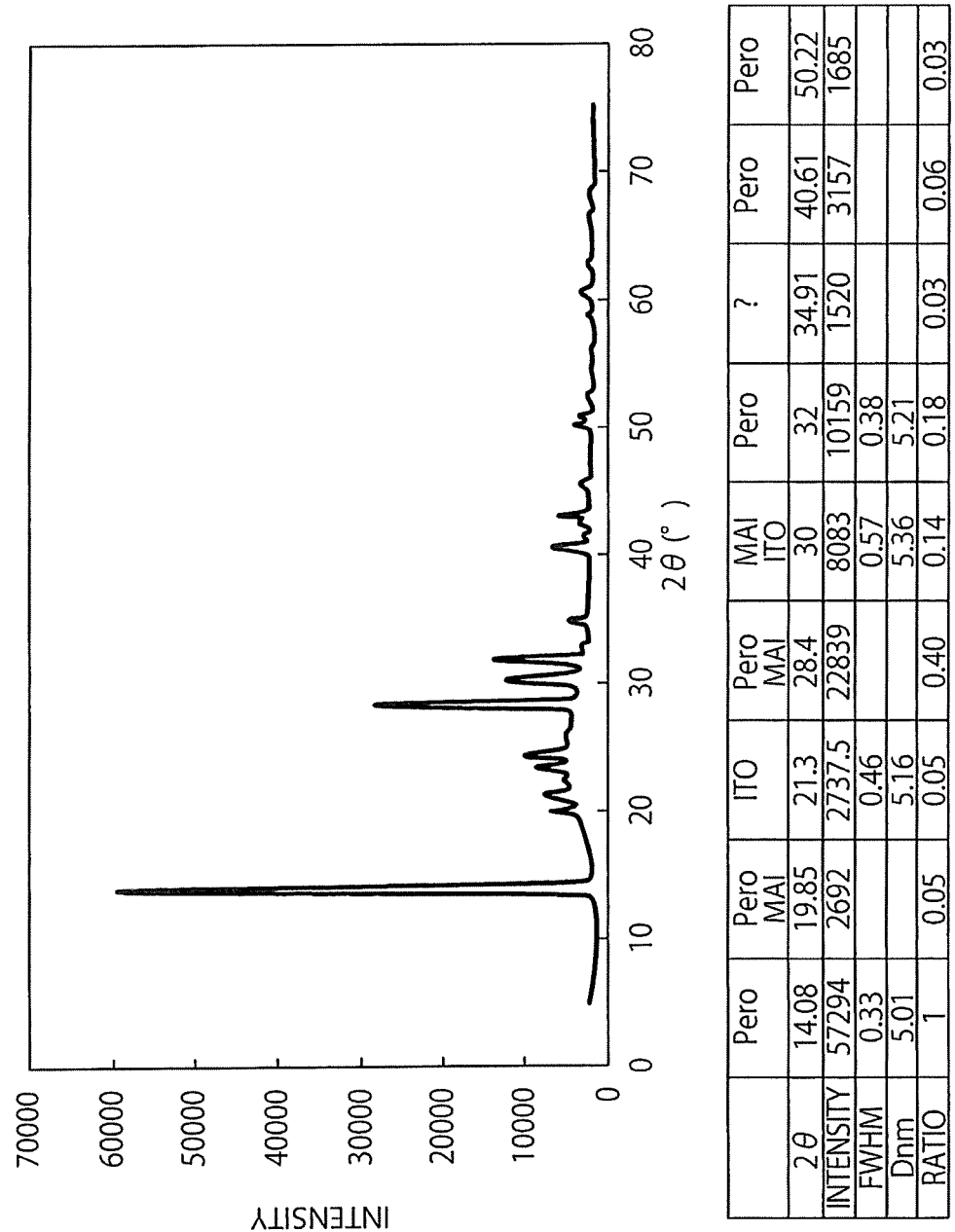
FIG. 11 shows an XRD profile of the perovskite layer in Comparative example 4.
Figure 12:
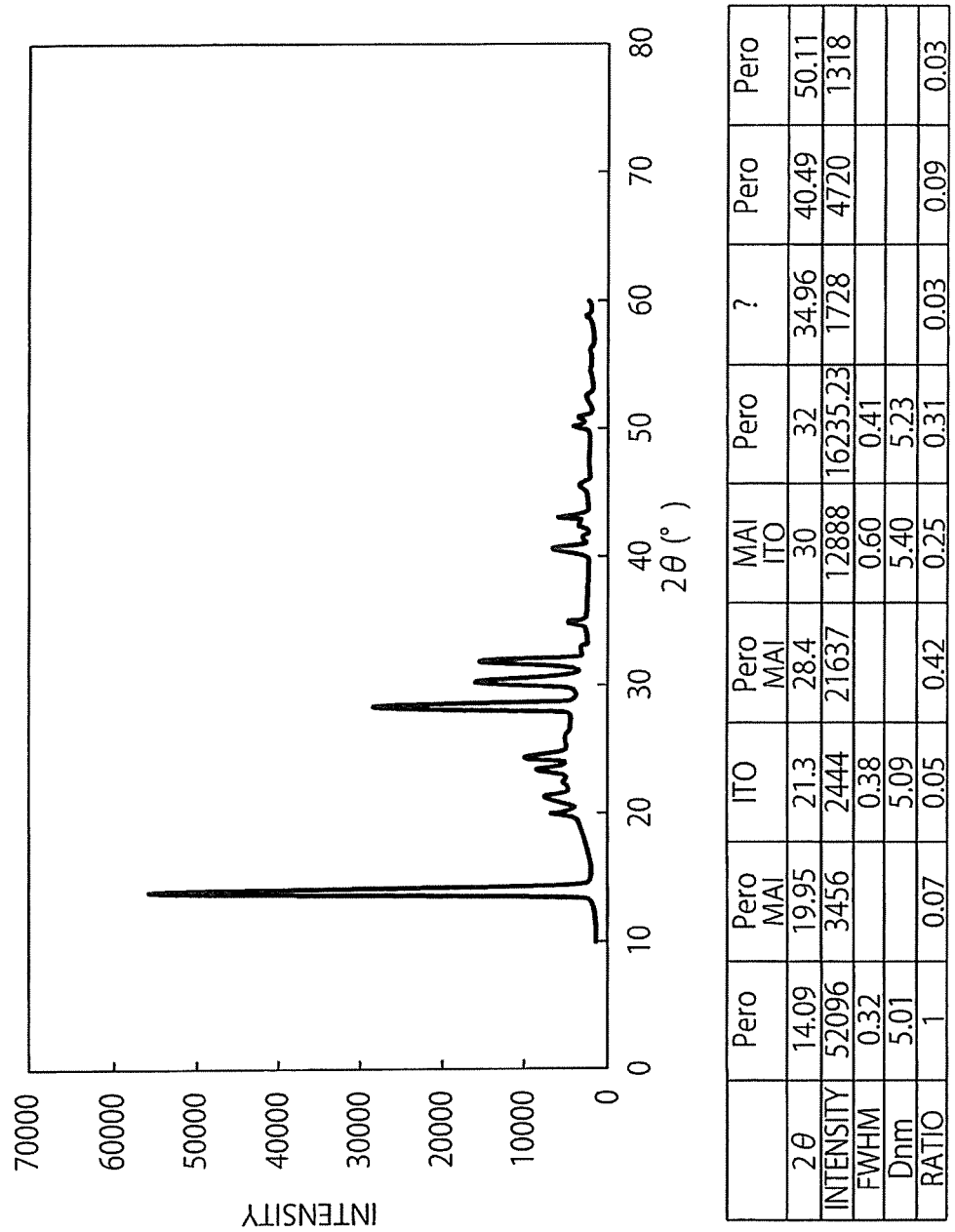
FIG. 12 shows an XRD profile of the perovskite layer in Example 4.
Figure 13:
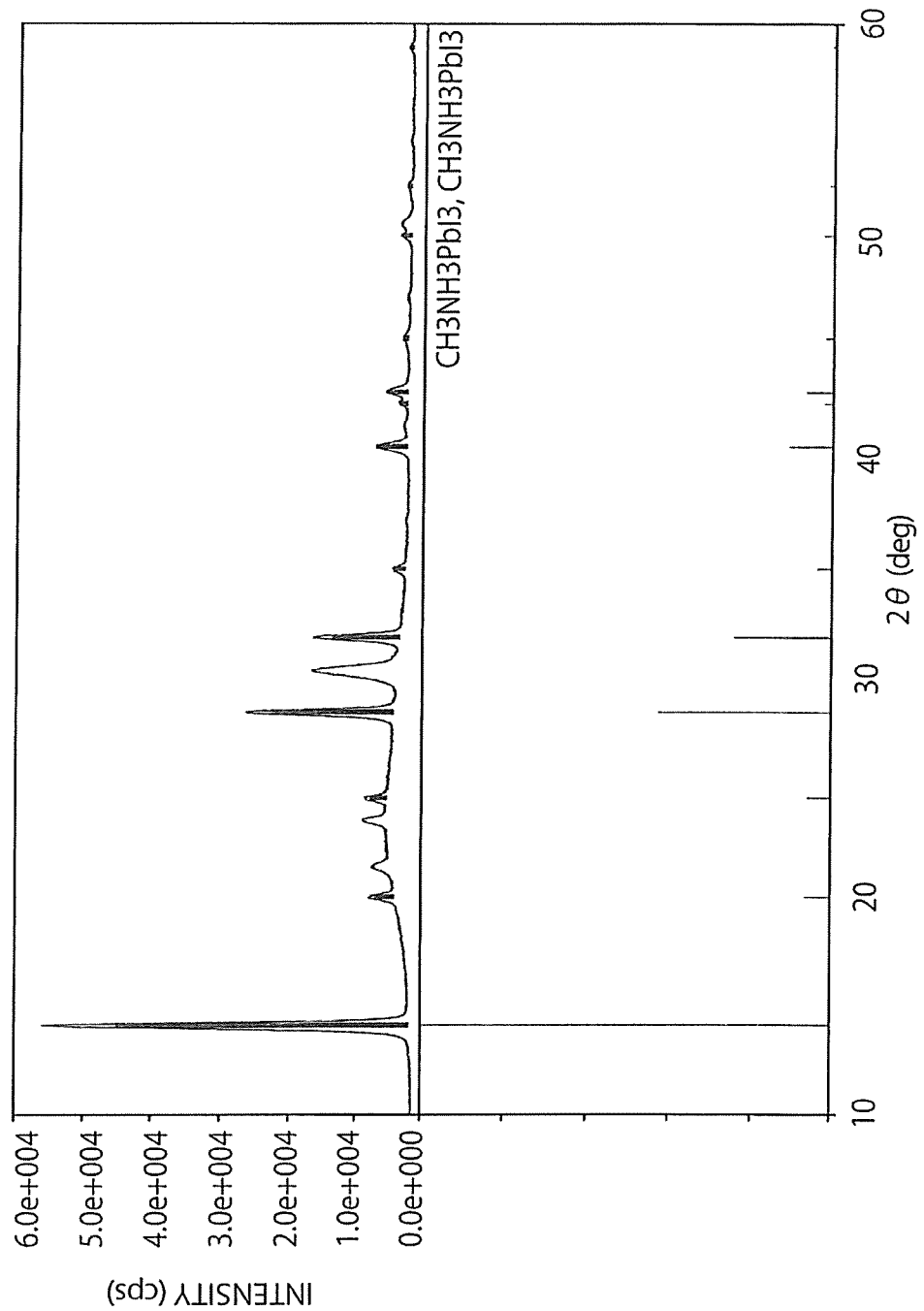
FIG. 13 shows an XRD profile of a crystal assigned to $a=8.9$, $c=12.6$ and the space group 14/mcm.

The procedures of Example 1A were repeated until the step of forming the perovskite layer, to prepare samples, which were then subjected to XRD measurement. The results are shown in FIG. 11 (Comparative example 4, not undergoing gas-blowing) and FIG. 12 (Example 4, undergoing gas-blowing). In both profiles, some diffraction peaks assigned to the perovskite structure are observed. However, from comparison of the intensity ratio between the diffraction peaks at 14° and at 32°, the intensity ratio is found to be enhanced by gas-blowing. This means that the gas-blowing procedure promoted growth in the crystal orientation corresponding to the diffraction peak at 32°. FIG. 13 shows an XRD profile of a crystal assigned to a=8.9, c=12.6 and the space group 14/mcm. This XRD profile corresponds well in both diffraction angle and peak intensity ratio with that of the sample subjected to gas-blowing. It is presumed that many crystalline nuclei are formed by gas-blowing to promote growth of the perovskite structure. Further, it is also presumed that the crystal growth is not oriented in a particular direction because the intensity ratio corresponds well.

Fifth Examples

The procedures of Example 1A were repeated except that the undercoat layer containing PEDOT:PSS was replaced with an undercoat layer containing 4-fluorobenzoic acid (FBA). After FBA was mixed with IPA, the concentration thereof was controlled to be 1 mM. The mixture was heated at 40° C. to dissolve FBA homogeneously, and the obtained solution was spin-coated at 350 rpm. In the subsequent procedures, the sample was subjected (Example 5) or not subjected (Comparative example 5) to gas-blowing when the perovskite layer was formed.

Figure 14:
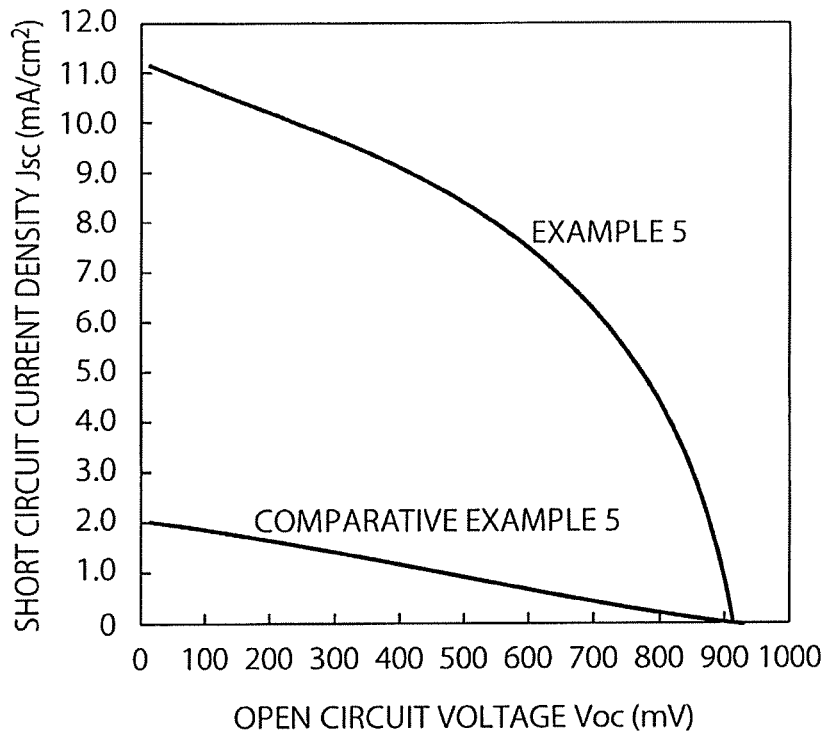
FIG. 14 is an I-V diagram of the elements in the fifth examples.

Table 4 and FIG. 14 show I-V characteristics and conversion efficiencies of the resultant elements. As shown in them, the element not subjected to gas-blowing had a small short circuit current density (Jsc) and hence the perovskite layer was thought to be not sufficiently formed therein. On the other hand, because of gas-blowing, the current density was increased and the conversion efficiency was enhanced from 0.49% to 4.51%. Thus, it was verified that, even if the undercoat layer comprises FBA, it is also possible to produce an excellent element.

TABLE 4

|  | Ex. 5 | Com. 5 |
|---|---|---|
| Voc (mV) | 915 | 911 |
| Jsc (mA/cm$^2$) | 11.3 | 2.1 |
| Pmax (mW) | 4.51 | 0.49 |
| FF | 0.44 | 0.26 |
| η (%) | 4.51 | 0.49 |
| Psh (Ω) | 195 | 434 |
| Ps (Ω) | 21.4 | 504.4 |

As revealed in the fourth examples, formation of the perovskite structure is promoted by gas-blowing. In addition, it is also revealed that the perovskite structure can be formed on even an undercoat layer on which the perovskite structure is thought to be difficult to form and thereby that the short circuit current density can be enhanced. This means that, according to the method of the embodiment, the perovskite structure can be formed not on a conventional undercoat layer of, for example, titanium oxide, which needs to undergo a high-temperature treatment in film-formation but on an undercoat layer of materials capable of forming a film at a low temperature.

Sixth Examples

The elements of Example 1A (which had an undercoat layer of PEDOT:PSS) and Example 5 (which had an undercoat layer of FBA), and an element which had an undercoat layer of TiO$_x$ and which was produced without carrying out gas-blowing (Comparative example 6) were subjected to a heat resistance test according to JIS C8938 (environmental test and durability of amorphous solar cell module). The element of Comparative example 6 was different in that the first and second electrode were made of FTO and gold, respectively, and in that a buffer layer of spiro-OMeTAD(2,2',7,7'-tetrakis(N,N-di-p-methoxy-phenylamino)-9,9'spiro-bifluorene was formed between the second electrode and the perovskite layer. The element of Comparative example 6 had a standard constitution as a conventional photoelectric conversion device. Since the active layer was formed without carrying out gas-blowing, the perovskite structure grew according to TiO$_x$ in the undercoat layer.

Figure 15:
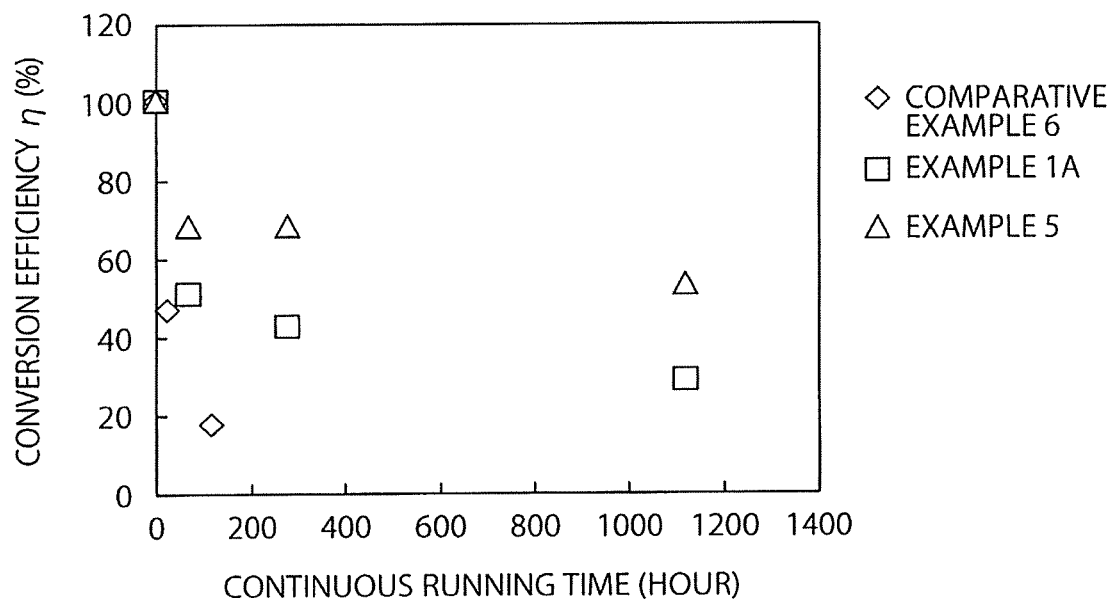
FIG. 15 shows change of the conversion efficiency depending on the continuous running time in the sixth examples.

FIG. 15 shows change of the conversion efficiency of each element. As shown in that, the efficiency of the standard constitution deteriorated to about 20% of the initial efficiency after about 100 hours. In contrast, the elements of Examples 1A and 5 according to the embodiment showed improved durability. The improvement in durability is presumed to be attributed to that in crystallizability. It is also shown that the element of Example 5 had relatively higher durability than that of Example 1A. That is presumed to be because water contained in the coating solution of PEDOT:PSS caused damages on the perovskite layer. Actually, the surface of that element was observed with the eyes to find spots where the color was changed into yellow. They were thought to appear because the perovskite structure was damaged by water.

Seventh Examples

The procedures of Example 5 were repeated except for cooling the substrate during the procedures, to produce an element (Example 7A). The temperatures of the blown gas and the substrate were 20° C. and 15° C., respectively. After the PCBM layer was formed by spin-coating, the surface thereof was polished with KIMTEX ([[trademark], manufactured by NIPPON PAPER CRECIA CO., LTD.]. Thereafter, the coating solution was again spin-coated thereon at 500 rpm to form the PCBM layer.

If the substrate was not cooled (Example 7B), the active layer showed an opaque color. However, when cooled, the layer became transparent. The opaque color is hence presumed to be largely caused by the interface structure between the active layer and the undercoat layer. Specifically, it is presumed that inner stress was stored according as volume shrinkage was promoted by crystallization of the perovskite structure and finally peeled the active layer partly from the undercoat layer, so as to form a light-scattering structure. In contrast, when the substrate was cooled, it is presumed that the solvent was evaporated moderately enough and hence the crystal grew slowly enough to relax the inner stress so as to inhibit formation of the light-scattering structure and to obtain the active layer of high transparency.

Figure 16:
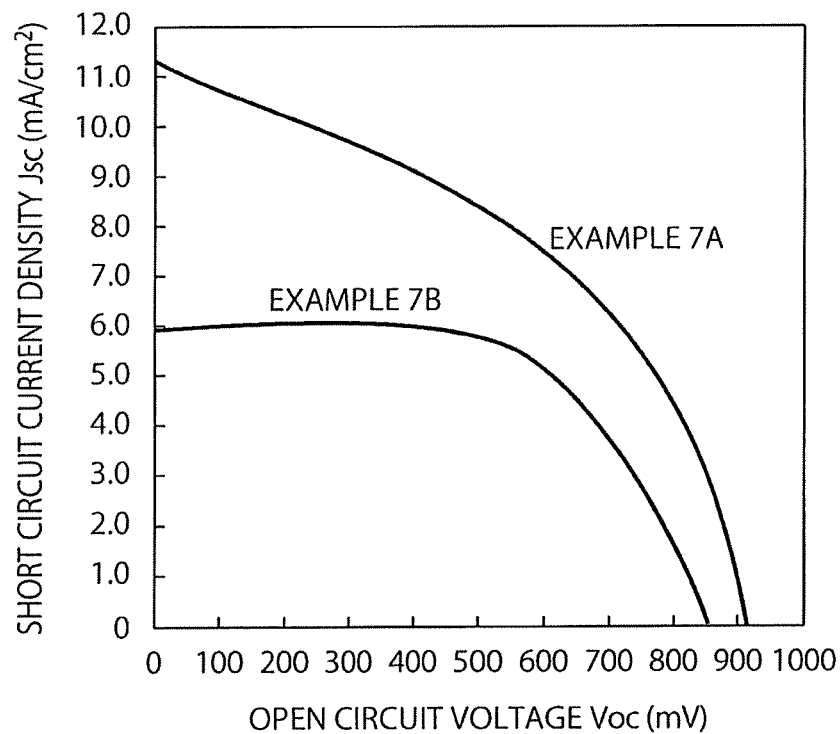
FIG. 16 is an I-V diagram of the elements in the seventh examples.

Table 5 and FIG. 16 show I-V characteristics of the resultant elements. As shown in FIG. 16, it was found that the embodiment can realize high fill factors. From those fill factors, it was verified that dark current characteristics attributed to the structures of the elements were improved and that carrier recombination in carrier transportation was reduced.

TABLE 5

|  | Ex. 7A | Ex. 7B |
|---|---|---|
| cooling/polishing of substrate | done | not done |
| Voc (mV) | 956 | 915 |
| Jsc (mA/cm$^2$) | 5.9 | 11.3 |
| Pmax (mW) | 3.08 | 4.51 |
| FF | 0.61 | 0.44 |
| η (%) | 3.08 | 4.51 |
| Psh (Ω) | −1616 | 195 |
| Ps (Ω) | 33.0 | 21.4 |

The element subjected to cooling and that not subjected to cooling were observed with the eyes. When the cooled element was observed from the light-receiving surface, the background was seen through the element because light-scattering was reduced. On the other hand, however, because of light-scattering, the background was not seen through the element not subjected to cooling. It is thus verified that the bonded interface was improved by cooling.

Eighth Examples

The procedures of Example 7A were repeated until the second spin-coating step of the PCBM layer, to produce a sample. Independently, the procedures of Example 7A were repeated except that the PCBM layer formed by the first spin-coating step was not polished and immediately subjected to the second spin-coating step, to produce another sample. The samples were observed with the eyes. As a result, it was found that the polishing procedure enables the element to have a smooth and even surface. On the other hand, the element not subjected to the polishing procedure is found to have an uneven surface even if coated twice with the PCBM coating solution. If subjected to gas-blowing, that element can have a surface of high smoothness. However, the surface often has bumps in some areas. Those bumps cannot be completely hidden even when the PCBM layer is formed on the active layer, and therefore they are thought to cause unevenness. The surface free from unevenness is thought to be obtained because the bumps of the active layer were removed in the polishing procedure carried out after the PCBM solution was cast. It is thought that the bumps of the perovskite layer penetrate through the PCBM layer and cause short-circuits between the active layer and the second electrode, and hence excellent conversion efficiencies can be obtained by removing them.

Ninth Example

The procedures of Example 1A were repeated except for adopting HIL1.1 in place of AI4083 of PEDOT:PSS.

Figure 17:
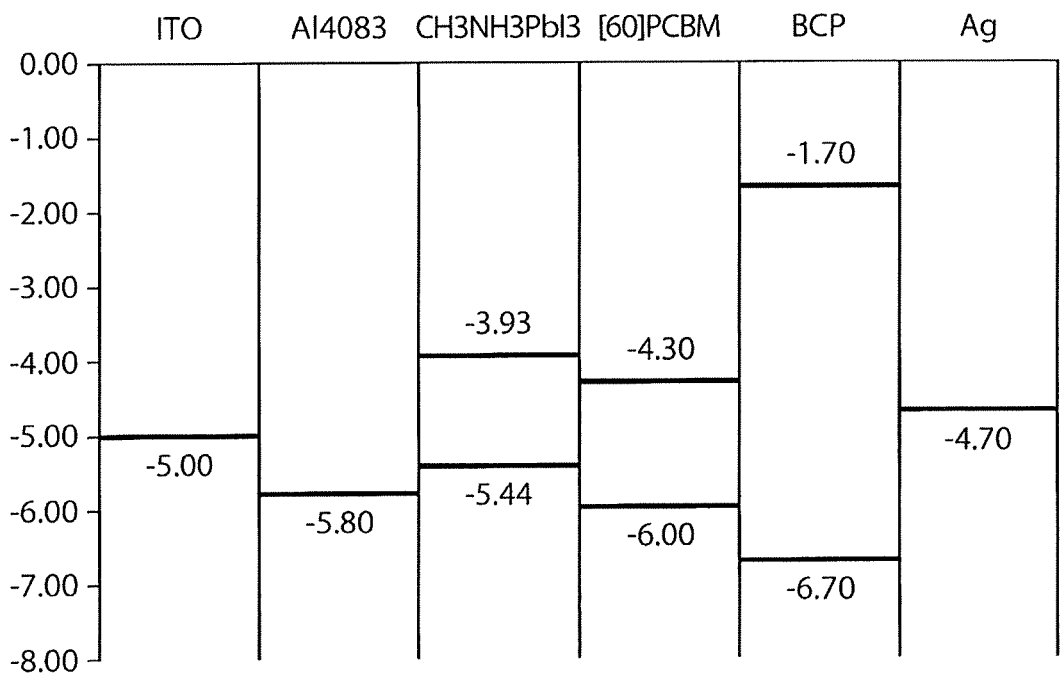
FIG. 17 is an energy diagram of the elements in the ninth examples.

After diluted to twice with 30% aqueous solution of isopropyl alcohol, HIL1.1 was spin-coated at 5000 rpm. The formed coating layer was dried at 140° C. for 10 minutes, and then the thickness was measured and found to be 10 nm. FIG. 17 shows an energy diagram thereof. The ionization potential of HIL1.1 and the valence band of the perovskite layer are −5.8 eV and −5.44 eV, respectively. They can be measured according to YPS (yield photoelectron spectroscopy in air), UPS (ultraviolet photoelectron spectroscopy) or the like.

Figure 18:
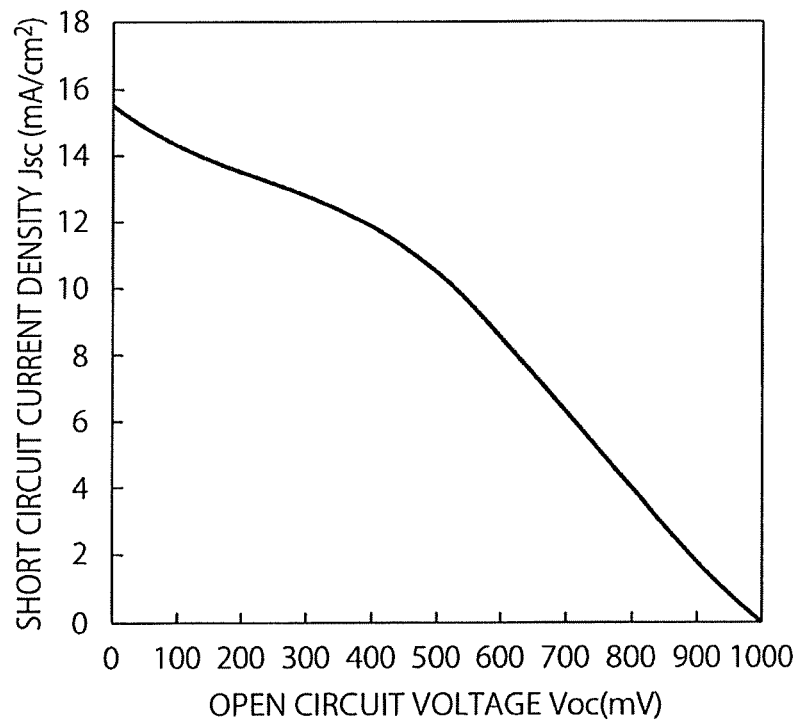
FIG. 18 is an I-V diagram of the elements in the ninth examples.
Figure 19:
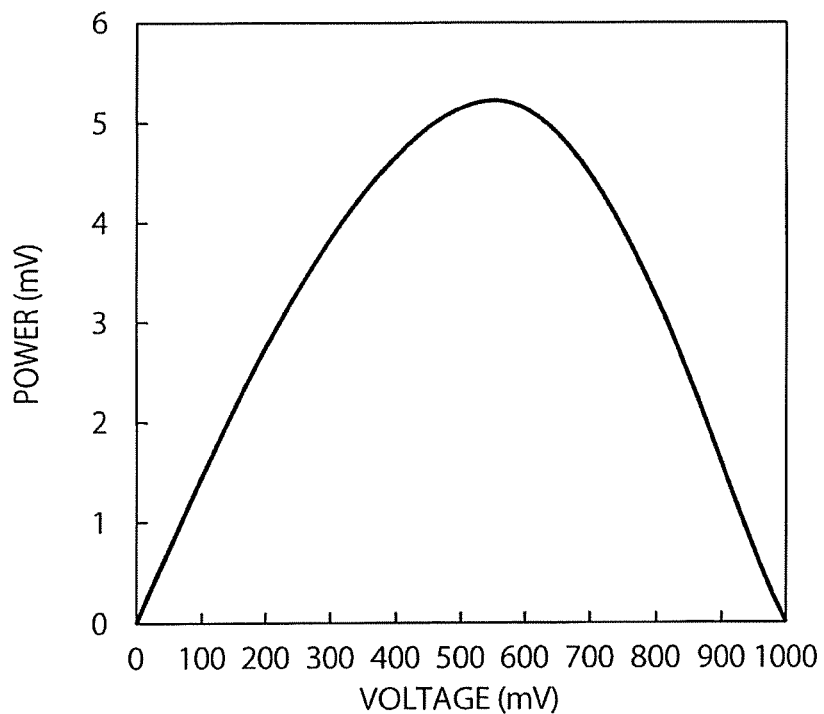
FIG. 19 is a characteristic diagram showing a relation between the voltage and the power of the element in the ninth example.

The resultant element had I-V characteristics and a conversion efficiency shown in Table 6 and FIG. 18. As shown in them, the Voc value can be improved while the conversion efficiency is kept at the same level. The relation between the voltage and the power was plotted (in FIG. 19) on the basis of the obtained data. As indicated in the drawing, it was found that the voltage was about 600 nm at the maximum power (Pmax). FIG. 19 also shows that the short circuit current density was about 8 mA/cm² at that point. The element of this example generates its maximum power when the short circuit current density is 11 mA/cm². From the viewpoint of the whole system, it is advantageous to enhance the conversion efficiency by increasing the voltage. That is because an element operated with a large current value tends to be largely effected by electric resistance when it is upsized.

TABLE 6

|  | Ex. 9 |
|---|---|
| Voc (mV) | 1002 |
| Jsc (mA/cm²) | 15.4 |
| Pmax (mW) | 5.23 |
| FF | 0.34 |
| η (%) | 5.23 |

TABLE 6-continued

|  | Ex. 9 |
|---|---|
| Psh (Ω) | 112 |
| Ps (Ω) | 50.4 |

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

The invention claimed is:

1. An apparatus for manufacturing a semiconductor element comprising a first electrode, a second electrode, an active layer having a perovskite structure, and a substrate; provided with
a nozzle through which a gas is blown onto a coating film formed by directly or indirectly coating said first or second electrode with a coating solution that contains a precursor compound for the perovskite structure and an organic solvent capable of dissolving said precursor compound,
a measuring unit with which the part where the gas is blown through said nozzle is observed,
a controlling unit with which the position where the gas is blown through said nozzle and the amount of gas to blow are controlled according to the observation with said measuring unit, and
a temperature controlling unit with which said substrate is controlled to be at a temperature lower than said gas while said coating film is being blown with said gas,
wherein an absorption spectrum at the part where the gas is blown through said nozzle is measured with said measuring unit.

2. The apparatus according to claim 1, wherein the position where the gas is blown through said nozzle and the amount of gas to blow are controlled with said controlling unit on the basis of absorptance measured with said measuring unit in the wavelength range of 700 to 800 nm.

3. The apparatus according to claim 1, wherein said nozzle is selected from the group consisting of a straight spraying nozzle, a conical spraying nozzle, and a fan spraying nozzle.

4. The apparatus according to claim 1, wherein said nozzle comprises a gas-flow guide which form a space comprises a pipe and a flange, said flange and said coating film form a space between them.

5. The apparatus according to claim 1, wherein said measuring unit is equipped with an absorption spectrometer.

6. The apparatus according to claim 1, wherein said apparatus further comprise a substrate holder in which the substrate is fixed.

7. The apparatus according to claim 1, wherein said apparatus further comprise a coating unit with which the coating solution is applied to said first or second electrode.

\* \* \* \* \*